(12) United States Patent
Yosef et al.

(10) Patent No.: US 9,736,962 B2
(45) Date of Patent: Aug. 15, 2017

(54) EFFICIENT TEMPERATURE FORCING OF SEMICONDUCTOR DEVICES UNDER TEST

(71) Applicants: M.D. Mechanical Devices Ltd., Haifa (IL); Lior Yosef, Haifa (IL); Eyal Simhon, Haifa (IL)

(72) Inventors: Lior Yosef, Haifa (IL); Eyal Simhon, Haifa (IL)

(73) Assignees: M.D. Mechanical Devices Ltd., Haifa (IL); Lior Moshe Yosef, Haifa (IL); Eyal Simhon, Haifa (IL)

( * ) Notice: Subject to any disclaimer, the term of this patent is extended or adjusted under 35 U.S.C. 154(b) by 0 days.

(21) Appl. No.: 13/975,072

(22) Filed: Aug. 23, 2013

(65) Prior Publication Data

US 2013/0340445 A1 Dec. 26, 2013
US 2016/0128225 A9 May 5, 2016

Related U.S. Application Data

(63) Continuation-in-part of application No. 13/405,870, filed on Feb. 27, 2012, now Pat. No. 9,677,822, and
(Continued)

(51) Int. Cl.
*F25D 25/00* (2006.01)
*H05K 7/20* (2006.01)
(Continued)

(52) U.S. Cl.
CPC ............ *H05K 7/20* (2013.01); *F25D 19/006* (2013.01); *F28F 3/12* (2013.01); *G01R 31/2874* (2013.01);
(Continued)

(58) Field of Classification Search
CPC .. F28F 3/12; F25D 19/006; F28D 2021/0071; F25B 21/02
See application file for complete search history.

(56) References Cited

U.S. PATENT DOCUMENTS 5,045,780 A * 9/1991 Swart ...................... 324/754.11
5,729,993 A 3/1998 Boiarski et al.
(Continued)

FOREIGN PATENT DOCUMENTS

WO WO 2015/025307 2/2015

OTHER PUBLICATIONS

Supplementary European Search Report and the European Search Opinion Dated Feb. 22, 2017 From the European Patent Office Re. Application No. 13892039.2. (7 Pages).
(Continued)

*Primary Examiner* — Lisa Caputo
*Assistant Examiner* — Janice M Soto

(57) ABSTRACT

A temperature-forcing system and method for controlling the temperature of an electronic device under test comprises a temperature-forcing head, including a face positionable in thermal contact with the device, and an evaporator, in direct or indirect thermal contact with the face; and a refrigerant circulation subsystem, including a compressor, a condenser, a flow control device for inducing a pressure drop in the refrigerant, and a conduit circuit through which the refrigerant is flowable. The subsystem cooperates with the evaporator so as to define at least one closed loop through which a corresponding bi-phase refrigerant is circulatable, so that, during circulation, the refrigerant is maintained in a liquid phase between the compressor and the flow control device and in a gaseous phase while flowing through the evaporator. The temperature of the device is therefore switchable by the head at a rapid rate of 50 to 150 degrees Celsius per minute.

21 Claims, 6 Drawing Sheets

Related U.S. Application Data a continuation of application No. PCT/IL2013/050714, filed on Aug. 22, 2013.

(51) Int. Cl.
  *F28F 3/12* (2006.01)
  *F25D 19/00* (2006.01)
  *G01R 31/28* (2006.01)
  *F25B 21/02* (2006.01)
  *F28D 21/00* (2006.01)
  *F25B 1/10* (2006.01)

(52) U.S. Cl.
  CPC ............... *F25B 1/10* (2013.01); *F25B 21/02* (2013.01); *F28D 2021/0071* (2013.01)

(56) References Cited

U.S. PATENT DOCUMENTS

| | | | |
|---|---|---|---|
| 6,324,856 B1 * | 12/2001 | Weng | 62/175 |
| 7,062,934 B2 * | 6/2006 | Craps et al. | 62/259.2 |
| 7,342,787 B1 | 3/2008 | Bhatia | |
| 7,876,116 B1 * | 1/2011 | Cheng et al. | 324/756.02 |
| 2003/0217558 A1 * | 11/2003 | Wall et al. | 62/223 |
| 2005/0200376 A1 * | 9/2005 | Yee et al. | 324/765 |
| 2007/0058350 A1 * | 3/2007 | Nakamura | 361/704 |
| 2007/0240871 A1 | 10/2007 | Hayashi et al. | |
| 2008/0134699 A1 * | 6/2008 | Leaver et al. | 62/129 |
| 2012/0111028 A1 | 5/2012 | Campbell et al. | |
| 2013/0220579 A1 | 8/2013 | Yosef et al. | |
| 2016/0128225 A9 | 5/2016 | Yosef et al. | |

OTHER PUBLICATIONS

Official Action dated Jun. 14, 2016 From the US Patent and Trademark Office Re. U.S. Appl. No. 13/405,870.
International Search Report and the Written Opinion dated Dec. 24, 2013 From the International Searching Authority Re. Application No. PCT/IL2013/050714.
Official Action dated Jul. 8, 2015 From the U.S. Patent and Trademark Office Re. U.S. Appl. No. 13/405,870.
Official Action dated Jan. 14, 2016 From the U.S. Patent and Trademark Office Re. U.S. Appl. No. 13/405,870.

* cited by examiner

EFFICIENT TEMPERATURE FORCING OF SEMICONDUCTOR DEVICES UNDER TEST

The present application is a continuation-in-part of U.S. patent application Ser. No. 13/405,870 filed Feb. 27, 2012 and bearing the same title. This application is also a continuation of PCT Patent Application No. PCT/IL2013/050714 filed Aug. 22, 2013.

FIELD OF THE INVENTION

The present invention relates to temperature forcing of electronic components and, in particular, to temperature forcing of semiconductor chips and modules during testing.

BACKGROUND OF THE INVENTION

In the electronic components semiconductor industry it is generally required to subject prototypes and production samples of semiconductor devices (chips or modules) to thorough electrical testing. Since specifications of a device typically include the range of ambient temperatures over which it should be operable, each device under test (DUT), and more specifically its casing, must generally be held during part of such testing at each of the extreme temperature values of the specified range (thus simulating the required extreme ambient temperature values). Such extreme values are typically between 125 and 165 degrees centigrade, at the high end, and between –40 and –70 degrees centigrade, at the low end. The process of thus keeping the case temperature of a DUT at one or the other of the specified extreme values is known as temperature forcing and is achieved, in common practice, by placing a heat conducting device in tight thermal contact with the DUT's casing and controlling its temperature so as to be held near the desired value. The heat conducting device and the system that controls its temperature are together referred to as a temperature forcing system (TFS).

Moreover, as is well known, operation of a semiconductor chip or any other electronic component is an exothermic process, wherein electric power fed to it is converted to heat, thereby tending to raise the temperature of the chip. This heat must be dissipated by the ambient air and/or external devices, as well as, generally, by the temperature forcing system, in order to limit the rise of the temperature, leaving the latter in equilibrium at the desired level. This is particularly true when testing at the low temperature range. When testing at a high extreme temperature, however, the exothermic process of the DUT may at times be insufficient to raise its casing temperature to the desired level, as all of the generated heat is dissipated by the ambient air and external devices. In this case the temperature forcing system, rather than dissipating heat, must supply heat to the DUT through its casing.

Two important requirements govern such temperature forcing: One requirement is that the temperature of the DUT, or its casing, be monitored and held at the desired level quite accurately and constantly (say—within 0.1 degrees C.). The other requirement is that the controlled temperature be switchable between the two extreme values (or to any other values) within a relatively short time (say—at a rate of 10-60 degrees C. per minute). It is noted that the temperature must be held constant even while varying operations in the chip (per test procedures), causing varying amounts of heat to be generated therein; the present invention aims at holding the DUT's temperature constant even while the input power dissipated by the DUT varies between a fraction of a watt and several hundred watts. Another, obvious, requirement is that any test setup be operational with a wide variety of chip types to be tested, having different heat-generating characteristics.

During testing, a semiconductor device (e.g. a packaged chip or an electronic module) is typically held in a test jig so that electrical terminals on its bottom surface are in contact with appropriately configured electrical test circuitry, while its top surface is accessible for temperature forcing. Other test configurations are also possible and are equally addressed by the present invention.

A typical temperature forcing system of prior art comprises a thermal head that is placeable in thermal contact with the DUT, a chiller and a circulation system that circulates a heat transfer fluid between two heat exchangers—one in the chiller and one in the thermal head. The chiller is a conventional refrigeration system, operational to extract heat from its heat exchanger and thus to cool the heat transfer fluid to substantially below the extreme low temperature of the desired testing range. The heat transfer fluid is generally designed to remain liquid throughout the circulation system and over the entire range of the testing temperatures. When passing through the thermal head's heat exchanger, the transfer fluid extracts heat from the thermal head, thus, in turn, cooling it.

Such a prior-art system has three major drawbacks: (a) The presence of two heat exchangers in tandem causes a relatively large cumulative temperature differential between the chiller and the DUT, thus reducing the efficiency of the process and placing a sometimes unacceptable limit on how low the temperature of the latter may be forced with a simple (single-stage) refrigeration system. (b) Heat dissipation in the thermal head's heat exchanger is based on the principle of Forced Heat convection, whose heat transmission factors are low (by several orders of magnitude relative to the principle on which the present invention is based); this seriously limits the rate at which the DUT temperature may be changed during testing. (c) The relatively large heat capacity of the circulating transfer fluid further limits the rate at which the temperature may be switched.

It is an object of the present invention to provide a temperature-forcing system for controlling the temperature of an electronic device under test more quickly and accurately than one of the prior art.

Other objects and advantages of the invention will become apparent as the description proceeds.

SUMMARY OF THE INVENTION

The present invention improves the process of temperature forcing of an electronic device under test, over prior art, by providing that the cooling of the device, or of a member in direct or indirect thermal contact therewith, be effected directly by the evaporation of a bi-phase refrigerant, rather than by the flow of an intermediate single-phase transfer fluid (gaseous or liquid) that, in turn, exchanges heat with a remote cooling apparatus. One important advantage of this arrangement, over prior art, is that it involves fewer stages of heat transfer, with their associated temperature differentials, thus achieving greater thermal efficiency—enabling, for example, to achieve lower device temperatures for a given set of refrigeration parameters or, conversely, to utilize a smaller and less powerful, compressor to attain a given device temperature. Another important advantage of this arrangement, to be explained below, is the greater speed at which the device temperature may be switched.

Basically, a system according to the present invention comprises a central unit, at least one temperature-forcing head (termed in the sequel interchangeably also "thermal heads" or "heads", for short), attachable to device-holding test jigs, each connected by a pair of supply- and return tubes to the central unit, and a bi-phase refrigerant that circulates throughout this combination. During operation, for each active temperature-forcing head, the refrigerant flows, in generally liquid state, from the central unit, through the supply tube to the head, where some or all of it evaporates while dissipating heat therefrom and whence it returns, generally in a mixed liquid- and gaseous phase, through the return tube, to the central unit and then it recirculates.

The central unit basically includes a compressor and a condenser (which is preferably coupled with an atmospheric heat exchanger). The head basically includes a thermal contactor, having a face configured to be put in thermal contact with the electronic device, and an evaporator part, directly or indirectly in thermal contact with the thermal contactor, and particularly with the heat spreader. In some configurations the thermal head, and particularly the thermal contactor part, includes a thermoelectric cooler (TEC), in direct thermal contact with other portions of the head. The term "thermal contact" (between two components) is here used to denote either (in the case of direct thermal contact) a direct physical contact between the components that allows heat transfer between them or (in the case of indirect thermal contact) a physical contact between each of the components and an intermediary, mutually adjacent, heat conducting member.

The evaporator is formed as a flow-through enclosure and includes an inlet port and an outlet port, connected with the supply tube and the return tube, respectively, thus being in the flow path of the refrigerant. Additionally in the flow path, between the condenser and the evaporator, there is a metering device, such as (but not limited to) an expansion valve or a capillary, which is a flow-restricting component, configured to continuously, adjustably or selectively create a pressure differential between the high pressure of the inflowing refrigerant produced by the compressor and the resulting low pressure in the outflowing refrigerant exiting the metering device.—and then caused to flow through the evaporator. The term high pressure is defined here as that pressure at which the refrigerant assumes the liquid phase when at normal atmospheric temperature and the term low pressure—that at which the refrigerant assumes the gaseous phase even when at the lowest temperature at which the evaporator is to operate. Part of the evaporator is preferably formed as a heat exchanger, configured to efficiently exchange heat between the refrigerant and the other parts of the head, so as to generally dissipate heat therefrom, (and thereby—from the DUT).

Preferably the end portion of the thermal contactor that comes in thermal contact with the device under test, known as heat spreader, is formed to have an end face that matches the upper face of the device in size and shape. Preferably the thermal contactor is configured as an exchangeable component of the temperature-forcing head, there being generally a plurality of thermal contactors adapted to be part of any one head. The plurality of thermal contactors may differ mutually in the shape of the heat spreader, so as to be usable with a corresponding plurality of device types. If the head is configured to include a TEC, the latter is preferably included in the thermal contactor. Thus the plurality of thermal contactors may also differ mutually as to whether or not they include a TEC and if they do—may differ in the type of TEC included.

Preferably there is at least one heat sensor imbedded in each of the evaporator wall and the heat spreader (in the thermal contactor), configured to provide temperature feedback signals, as described below. Also embedded in the heat spreader, in some configurations, is one or more heating elements, as described below.

Operation of the system is generally as follows: Firstly, the refrigerant which has been pressurized by the compressor is converted from the gas to liquid phase in the condenser, through heat dissipation by an atmospheric heat exchanger, or any other type of heat exchanger. When a low temperature is desired at the device under test, the refrigerant is made to flow through the metering device. The liquid refrigerant emerging from the metering device enters the evaporator, where low pressure prevails, wherein it comes into contact with the heat exchanger, or possibly with any other part or wall of the evaporator, to evaporate thereon into gaseous phase and thereby to dissipate heat therefrom and thus also—through the thermal contactor (and possibly through a TEC therein)—from the DUT. The resulting low pressure mixture of gas and liquid is drawn by the compressor, through the outlet port and the return tube, for another cycle. It is noted that the system thus operates essentially as a conventional cooling system, but wherein the evaporator and its associated heat exchanger are advantageously part of the temperature-forcing head, serving to dissipate heat therefrom in a highly efficient, as well as effective, manner. The efficiency is inherent to the topical evaporation (i.e. boiling) process, with its extremely high heat transfer coefficient, as well as to the single heat-exchange process (in contrast to double heat-exchange processes that typify prior-art systems), while effectiveness characterizes the fact that the heat-exchanger and the parts of the head thermally coupled thereto nearly reach the very low boiling temperature of the refrigerant.

In order to coarsely adjust the temperature at the evaporator (and thereby—the temperature forced on the DUT), the rate of heat dissipation therefrom may be alterable, by changing the rate—preferably the average rate—at which evaporating liquid refrigerant flows through the evaporator; this can be achieved by any of several means, depending on system configuration. Such adjustment is preferably controlled by using temperature feedback signals from one or more heat sensors imbedded in a wall of the evaporator. Preferably the control operation is by means of a central control unit. Such control capability is also applicable to coarsely maintaining a given temperature value at the evaporator (and thereby—at the face of the heat spreader) even while heat dissipation requirements vary under varying operations at the DUT (e.g. as dictated by test procedures).

When a high temperature is desired at the DUT (such as an extreme high temperature dictated by the test procedures), the operation described above can be modified so as to drastically reduce, or totally eliminate, heat dissipation from the evaporator. One manner of such modification is to drastically reduce the rate at which refrigerant flows through the evaporator—essentially as described above; in an extreme situation, the flow may be stopped altogether. Another possible modification is to cause the refrigerant to flow through the evaporator in gaseous phase only; in this case, generally no condensing and no evaporation takes place. If it is necessary to supply heat to the DUT (rather than to dissipate heat therefrom) in order to maintain it at a high temperature, heating elements in the heat spreader may be activated; if a TEC is included in the head, it may be run with reverse current, to supply heat as required.

Switching between high and low temperature levels, as is often required during testing, is effected by selectively applying the chosen modification to the flow of the refrigerant. It is noted that each of the two diverse temperature levels is mainly effected by a corresponding state of refrigerant flow through the evaporator; that is—a low temperature level is effected by a high average rate of flow of the refrigerant, in a state of evaporation, with consequent high rate of cooling of the heat exchanger, whereas a high temperature level is effected by a relatively low, or even zero, average rate of flow in the state of evaporating liquid or by the flow in gaseous phase only, with consequent low or zero rate of cooling. Since the change in the rate or in the phase mode occurs within the head and since the switching of the average rate or of the mode can be practically instantaneous, the resultant temperature change in the heat exchanger—and hence also in the device under test, which is in thermal contact therewith—is extremely fast. This is an important advantage of the invented system and contrasts with systems of prior art, wherein the temperature of an intermediary coolant must be switched, which takes a much longer time, owing to the relatively high heat capacity of the voluminous coolant and owing to the two (rather than one) heat exchange processes involved.

A high rate of switching of at least 50° C./min between high and low temperature levels is made possible by employing the aforementioned refrigeration cycle within the temperature-forcing head to benefit from at least the following factors: (1) direct cooling of the DUT, (2) a relatively low level of thermal inertia due to selection of a suitable refrigerant that is bi-phase at relatively low pressures, and (3) a large convective heat transfer coefficient on the order of 20,000 W/(m$^{2o}$ K) resulting from refrigerant boiling and the release of latent heat of vaporization during a liquid to gas phase change. The temperature switching rate will generally not exceed 150° C./min due to material deformation considerations.

As mentioned above, in some configurations of the invented system there is interposed between the heat exchanger and the heat spreader (preferably as part of the thermal contactor) a thermoelectric cooler (TEC), in thermal contact with both of these components. Its purpose is primarily to enable highly accurate and very fast control of the temperature in the DUT. Such control is achieved by sensing the temperature of the DUT or of the heat spreader—preferably by means of a suitably embedded sensor—and accordingly controlling the average electric current flowing through the TEC. At times, the TEC may also serve to provide additional temperature shift, to achieve temperature ranges at the DUT beyond what is achievable by the cooling subsystem alone. Thus, for an extremely low temperature at the DUT, the TEC is operated in its normal, cooling mode with a relatively high value of electric current; its face next to the heat spreader is thus kept at an appreciably lower temperature than that of the heat exchanger (as is effected by the coolant evaporation). The converse is true when aiming at an extremely high temperature at the DUT; if the heat produced by the latter is insufficient to raise its casing temperature to the desired level, even at zero dissipation by the cooling subsystem (i.e. complete stoppage of coolant circulation), the TEC may be operated in a reverse mode (i.e. with a reversed current flow), so that its face next to the heat spreader is at a substantially, yet controllably, higher temperature than the ambient temperature, causing an additional, temperature rise at the interface to the DUT and enabling the latter's temperature to be kept at the desired elevated level. To raise the forcing temperature even further, the current through the TEC may be increased to a level at which resistive (ohmic) heating takes effect.

In some configurations of the invented system, electrically resistive heating elements may be imbedded in one component or another of the thermal head (such as the heat exchanger or the heat spreader), in order to introduce additional heat and thus raise the temperature at the DUT to a desired high level. In configurations lacking a TEC, such a heating element may also be utilized to accurately control the forced temperature, by varying the magnitude of the electric current flowing therethrough (again, under control of a feedback signal obtained from a temperature sensor imbedded in the heat spreader or in the DUT itself); this mode of temperature control may also be applied for the case of low temperatures, by thus adding a small but controllable amount of heat to that dissipated by the highly cooled heat exchanger.

There is thus disclosed herein a temperature-forcing system, for controlling the temperature of an electronic device under test, comprising a temperature-forcing head, including a face positionable in thermal contact with said device, and an evaporator, in direct or indirect thermal contact with said face; and a refrigerant circulation subsystem, including a compressor, a condenser, a flow control device for inducing a pressure drop in said refrigerant, and a conduit circuit through which said refrigerant is flowable.

Said subsystem is configured to cooperate with said evaporator so as to define at least one closed loop through which a corresponding bi-phase refrigerant is circulatable, so that, during circulation, said refrigerant is maintained in a liquid phase between the compressor and the flow control device and in a gaseous phase while flowing through the evaporator, wherein the temperature of said device is switchable by means of said head at a rate of 50 to 150 degrees Celsius per minute.

More specifically, in the disclosed system the refrigerant, while flowing through the evaporator at a low pressure, is operative to dissipate heat therefrom by evaporation and the evaporator or any part thereof is formed as a heat exchanger.

In various configurations of the system, the head further includes a thermo-electric cooler, one or more resistive heaters or one or more temperature sensors.

In some configurations of the system, the head is formed as two parts that are mutually attachable and detachable, one part being a thermal contactor, which includes the face that is configured to be put in thermal contact with a device under test. The thermal contactor may further include a thermoelectric cooler.

In one embodiment, the circulation subsystem is a two stage refrigeration cycle by which a first stage refrigerant pressurized by a first compressor is delivered to a heat exchanger whereat it cools a second stage refrigerant pressurized by a second compressor to a pressure greater than the pressure generated by said first compressor, for an increased cooling effect.

As additional features of the disclosed system, the refrigerant circulation subsystem further includes a bypass conduit, configured to selectively provide a flow path for the refrigerant that avoids circulation through the evaporator, the subsystem is operative to circulate the refrigerant intermittently, with a variable duty cycle, or at a variable rate of flow and the metering device is an adjustable expansion valve.

In some configurations, the system further comprises a tube assembly, attached to the head and configured to pass the refrigerant from the subsystem to the evaporator and back from the evaporator to the subsystem, wherein the tube assembly is connectable to, and detachable from, the subsystem. In some configurations, the system comprises one or more additional temperature-forcing heads, each similar to the disclosed temperature forcing head, wherein the subsystem is configured to similarly circulate the bi-phase refrigerant also through the evaporator of each of the additional heads.

Also disclosed herein is a temperature-forcing head, for controlling the temperature of an electronic device under test, comprising a thermal contactor, configured with a face adapted for thermal contact with the device and an evaporator, in direct or indirect thermal contact with the thermal contactor and configured to be connectable to a circulation system for circulating a bi-phase refrigerant in a gaseous phase through the evaporator and in a liquid phase through a condenser, wherein the temperature of said device is switchable by means of said head at a rate of 50 to 150 degrees Celsius per minute.

More specifically, in the disclosed head the evaporator or any part thereof is formed as a heat exchanger and is configured to transfer heat to any bi-phase refrigerant, entering it in liquid phase and flowing therethrough at a low pressure, by evaporating the refrigerant.

Also disclosed herein is a method for dissipating heat from a thermal head while in thermal contact with an electronic device under test, comprising (i) providing a bi-phase refrigerant and a circulation system therefor, in fluid communication with a portion of the thermal head; and (ii) causing at least some of said refrigerant, while in liquid phase, to come in thermal contact with said portion, whereby at least some of the refrigerant evaporates, wherein the temperature of said device is switchable by means of said head at a rate of 50 to 150 degrees Celsius per minute.

The present invention is also directed to a method for forcing the temperature of an electronic device under test, comprising (i) providing a thermal head, including an evaporator part, and placing it in thermal contact with the device; (ii) connecting the head to a circulation system and causing said system to circulate a bi-phase refrigerant through the evaporator part; and (iii) when heat dissipation from the device is required, causing at least part of said refrigerant to enter the evaporator in liquid phase, whereby it dissipates heat therefrom by evaporation, wherein the temperature of said device is switchable by means of said head at a rate of 50 to 150 degrees Celsius per minute.

DETAILED DESCRIPTION OF PREFERRED EMBODIMENTS

Figure 1:
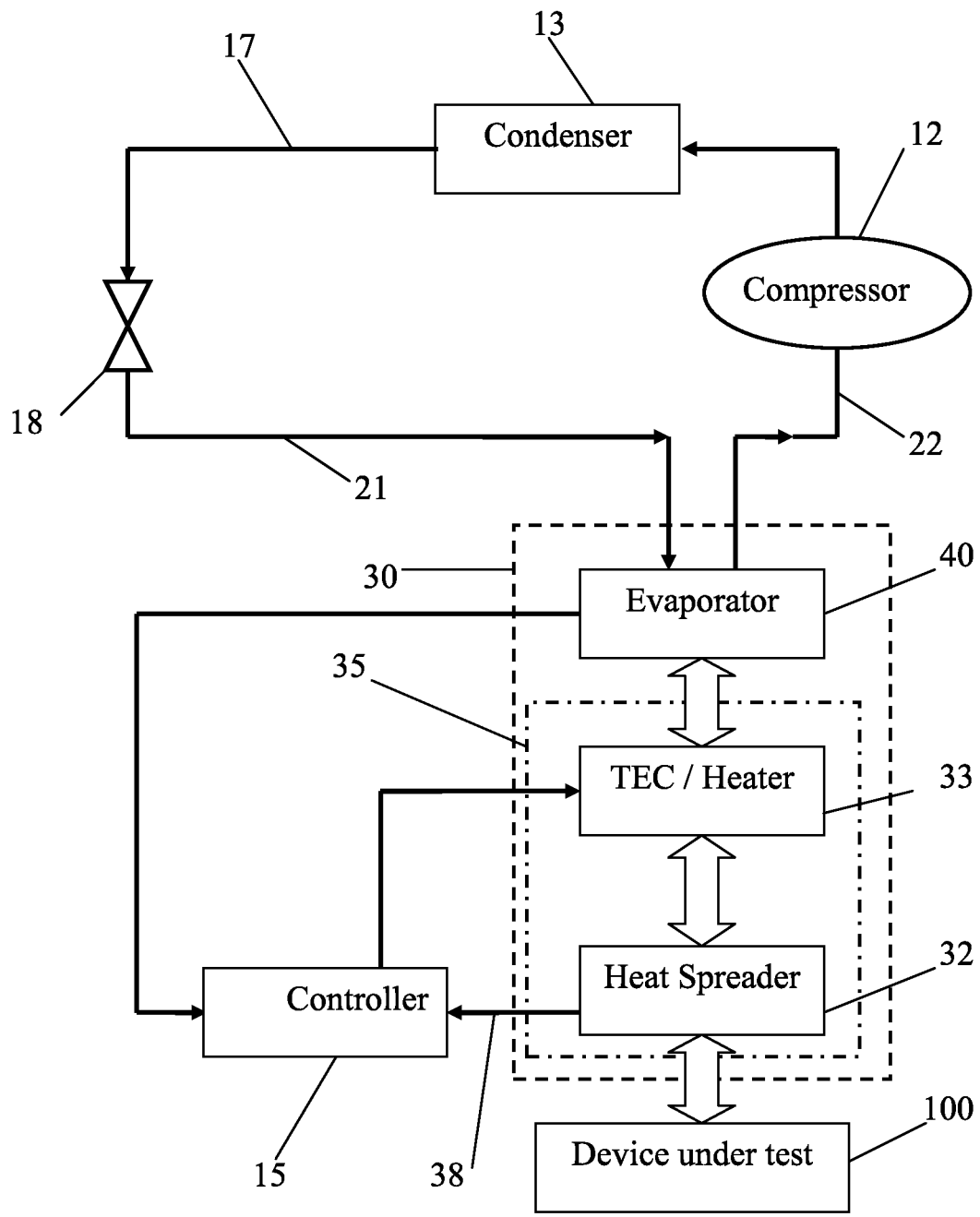
FIG. 1 is a schematic overall block diagram of a temperature-forcing system according to one embodiment of the present invention.
Figure 2A:
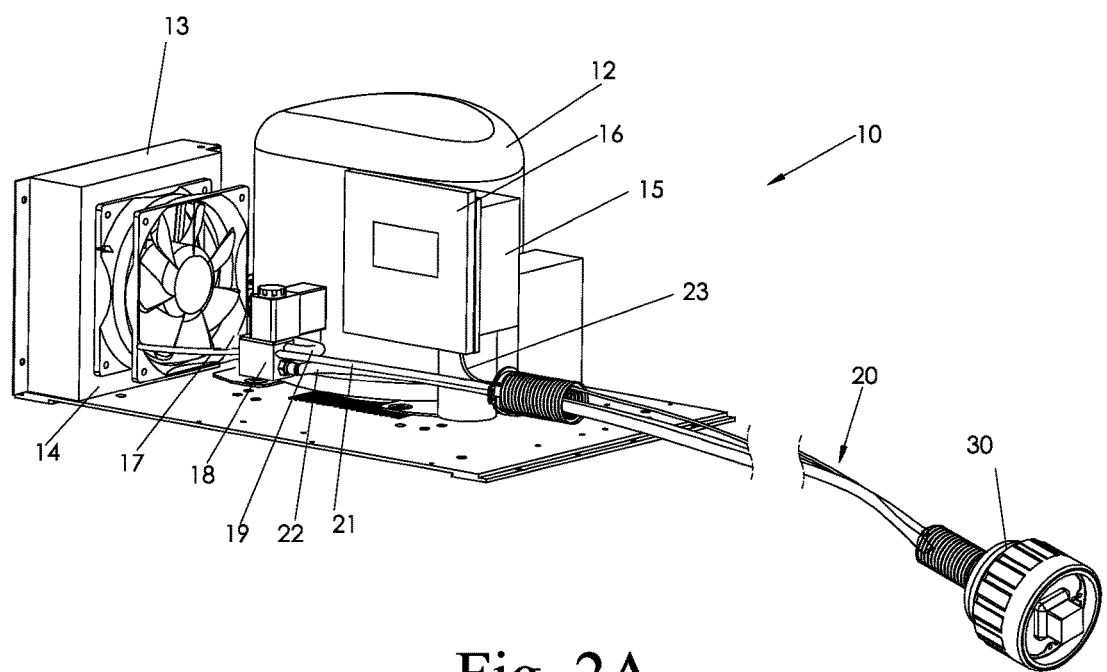
FIG. 2A is a schematic isometric drawing of an embodiment of the temperature forcing system of FIG. 1, showing a central unit and a thermal head.

Reference is made to both FIG. 1, which shows a temperature-forcing system according to an embodiment of the invention schematically in block diagram manner, and FIG. 2A, which depicts a particular embodiment of the system in an isometric view. The system is generally configured and operative to circulate a bi-phase refrigerant through a temperature-forcing head (thermal head).

A central unit 10, usually with an enclosing case (not shown), has a compressor 12, a condenser 13 in intimate thermal contact with an atmospheric heat exchanger, and an expansion valve 18. A pipe (not shown) connects the outlet of compressor 12 with the inlet of condenser 13, and another pipe 17 connects the outlet of condenser 13 to the inlet of expansion valve 18. The heat exchanger is in thermal communication with the atmosphere, aided by a fan 14. Also within the central unit 10 is a controller 15, in electrical communication with a control panel 16.

A tube assembly 20, preferably flexible, connects central unit 10 with a thermal head 30. In the presently illustrated configuration there is a single thermal head, but in other configurations there may be two or more thermal heads with their respective tube assemblies, connected in parallel to the central unit. The tube assembly includes a pair of tubes—a supply tube 21 and a return tube 22—as well as an electric cable 23 (which includes a number of wires). The inlet end of supply tube 21 is connected to the outlet of expansion valve 18, while the outlet end of return tube 22 is connected to the inlet of compressor 12. The electric cable 23 is connected to controller 15. It is noted that, with respect to the thermal head, the central unit 10 and the tubes 21 and 22 jointly form a refrigerant circulation system.

Expansion valve 18 is a preferred type of what may be generally referred to as a metering device, which is a fluid flow regulating component with an essentially narrow passageway that is configured to restrict flow in a manner that, in cooperation with the compressor, creates a pressure differential across it. In other words, it is operative to allow high pressure to be built up upstream to it (by the action of compressor 12), whereby the refrigerant is kept in liquid phase, while allowing low pressure to be maintained downstream to it, whereby the refrigerant is allowed to evaporate. The metering device may also be any of several other types, including, for example, a capillary tube. In some other configurations or embodiments, it may be disposed as part of the supply tube or as part of the thermal head. Preferably and as in the illustrated embodiment, expansion valve 18 is adjustable, that is the degree of stricture is variable; the narrower the passageway, the lower the rate of flow and the higher the pressure differential (up to the maximum achievable with a given compressor) and conversely—the wider the passageway, the higher the rate of flow (up to the maximum achievable with a given compressor) and the lower the pressure differential. As explained below, this adjustability may affect commensurate variability in the rate of heat dissipation from the thermal head and in the minimum temperature achievable therein.

In the illustrated configuration there is within the central unit 10 also a bypass conduit 19, leading from another outlet of the expansion valve 18 to the inlet of compressor 12. Passage of refrigerant through the bypass conduit is switchable—preferably within the expansion valve. As explained below, it may serve, when required, to eliminate any pressure differential and thus to prevent any cooling effect.

Figure 2B:
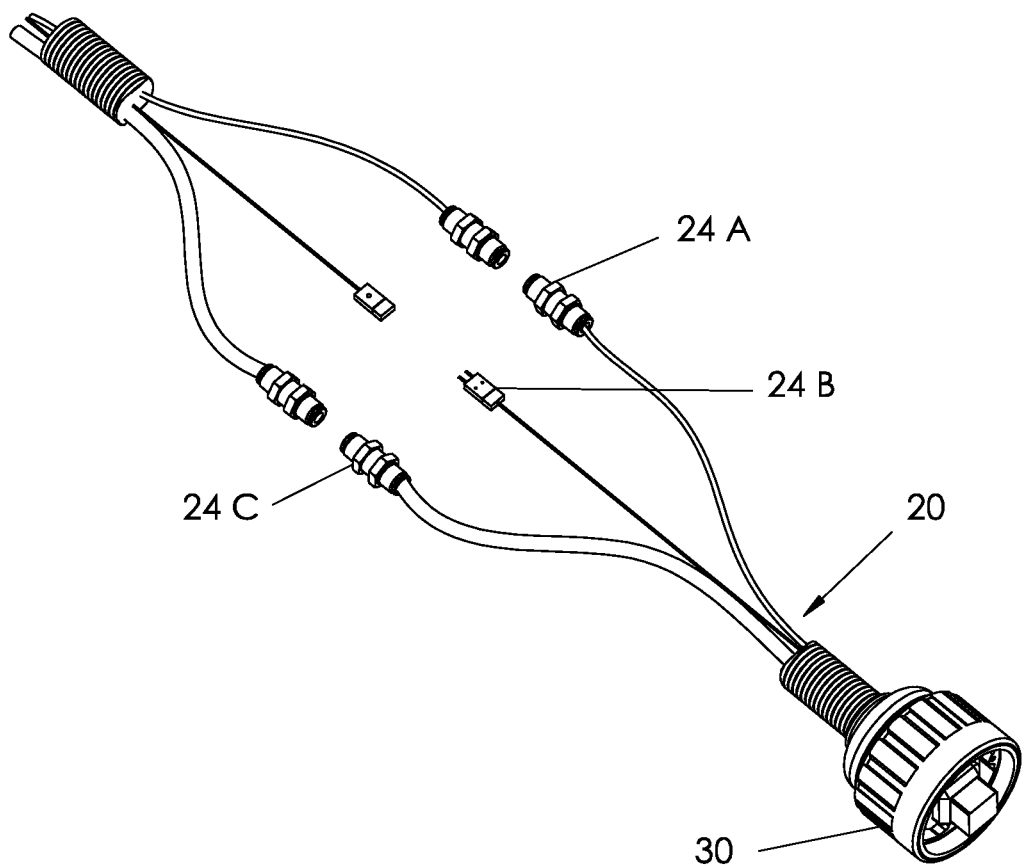
FIG. 2B is a schematic isometric drawing of an alternative configuration of the embodiment of FIG. 2A.

In an alternative configuration of the system, shown schematically in FIG. 2B, the tube assembly 20 consists of two sections that are interconnected by a set of matching connector pairs—connectors 24A for the supply tube, connectors 24C for the return tube, and connectors 24B for the electric cable. A first section of the assembly is configured as part of the central unit 10, the connectors at its end being preferably affixed to its case (not shown), while the second section is long enough to reach the test setup. The connectors are preferably configured for quick connection and quick release, as is commercially available. A suitable valve mechanism, commercially available, at each of the tube connectors blocks the refrigerant from leaking out while the tubes are disconnected. This configuration enables easy removal of the head from the central unit for servicing or for replacement; it also enables the alternate use of several different heads—possibly with tube assemblies of different lengths.

Thermal head 30 is configured to make thermal contact with a device under test, disposed in a test jig, and to thus dissipate heat from the device and (for the case of high-temperature testing) possibly supply heat thereto. Thermal head 30 is connected to the other end of tube assembly 20—in a manner further explained below—whereby, in particular, it is in fluid communication with the circulation system, providing fluid passage from supply tube 21 to return tube 22.

A bi-phase refrigerant, of any suitable type with low boiling point, such as Freon, including Freon R22, R134, R134a, R408A, R507 and R717, nitrogen, and carbon dioxide, but preferably Freon R23 (having a boiling point of $-115.7°$ F. at 1 atm) and/or R404A (having a boiling point of $-40.8°$ C. at 1 atm), closely circulates through the entire system, that is—it generally flows (in the order listed) from compressor 12, through condenser 13, expansion valve 18, supply tube 21, thermal head 30, and return tube 22, back to the compressor.

By virtue of its low boiling point, the refrigerant undergoes cavitation in a turbulent flow regime while circulating through its conduit circuit, providing a large convective heat transfer coefficient on the order of 20,000 $W/(m^{2}*°K)$. It is thus an advantageous feature of the invention that the refrigerant flows through the tube assembly and the thermal head—in contrast to a chiller non-boiling type system of the prior art which provides a convective heat transfer coefficient of only 2000-5000 $W/(m^{2}*°K)$, where the refrigerant is confined to a central unit, while a secondary coolant flows through tubes and the thermal head.

In some configurations, wherein the tube assembly comprises two interconnectable sections as described above, there can be provided a plurality of thermal heads 30, of different types and/or sizes, to serve for testing various types and sizes of devices, under various testing conditions. Each head is connected to a corresponding second section of tube assembly 20, interchangeably connectable to the central unit 10. In other configurations, each head is structured to have a detachable component thereof (the thermal contactor—to be described below), which is to thermally contact the DUT, and there can be provided a plurality of such components, interchangeably attachable to a thermal head and being of different types and/or sizes, to serve for testing various types and sizes of devices, under various testing conditions.

Figure 3:
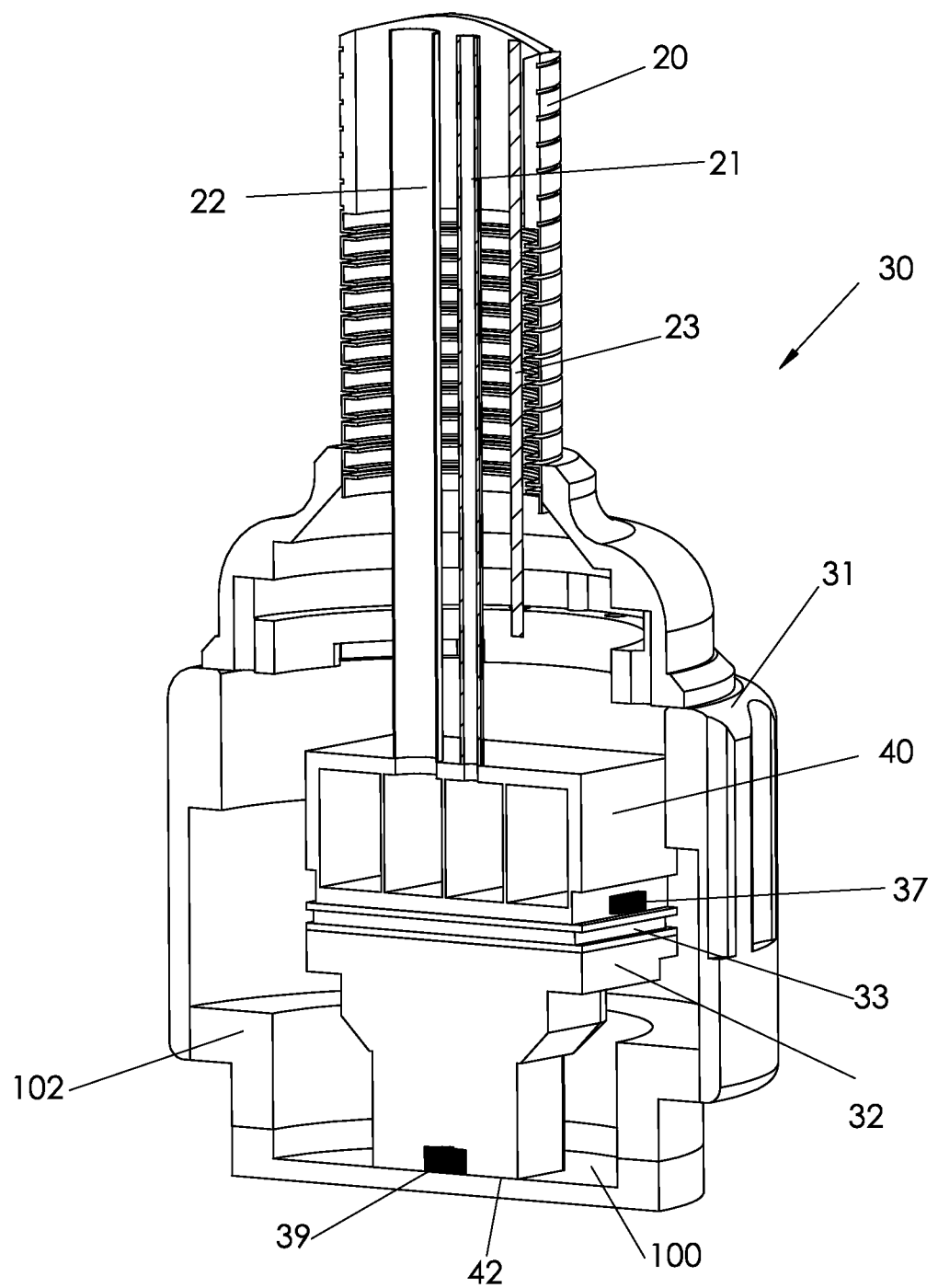
FIG. 3 is an axial-sectional view of an embodiment of the thermal head in the system of FIGS. 2A and 2B, in one configuration of the system.

FIG. 3 depicts schematically, in a cut-open isometric view, an embodiment of one configuration of a temperature-forcing (thermal) head 30. As seen in FIG. 3 and FIG. 1 collectively, the head is fixedly connected to the tube assembly 20 and includes a housing 31 and an assembly of components that are sequentially in thermal contact with each other. These typically consist of (in the listed order)—
 a heat spreader 32,
 a thermo-electric cooler (TEC) 33 and
 an evaporator 40.

Mutual thermal contact between these components (represented in FIG. 1 by wide double arrows) is achieved by flatness of their respective contacting surfaces and preferably enhanced by interposing a thin layer of heat-conducting substance, such as a thermal pad, thermal grease or Indium-based foil.

The housing 31 is adapted to mechanically engage test jig 102 so as to hold the thermal head in proper position with respect to the device-under-test (DUT) 100. The heat spreader 32, which is intended to ensure that DUT 100 will be maintained at a substantially constant temperature by which a maximum difference between an instantaneous high DUT temperature and low DUT temperature is no more than 0.10° C., has a face 42 configured to conform to the shape of, and to be placed in thermal contact with, the DUT 100. The heat spreader face 42 is preferably in physical contact with the DUT 100 in order to induce heat transfer by conduction. Imbedded in the heat spreader is a temperature sensor 39, available commercially, which is connected through wires 38 in cable 23 to controller 15 and operative to sense the temperature of the heat spreader, and thus indirectly also of the underlying device, and to send a corresponding signal to controller 15 (FIG. 2A). In some configurations of the thermal head, the heat spreader also includes one or more electrically resistive heating elements (not shown), to serve for supplying heat to the DUT when necessary; electric current is supplied to the heating elements from controller 15 through wires (not shown) in cable 23.

TEC 33 is a flat device, based on the Peltier effect, containing one or more bi-metal couplers (in series), which are electrically connected between two poles, to which direct voltage is applied during operation; the voltage is obtained through a pair of wires in cable 23 (which is part of tube assembly 20) from controller 15 (FIG. 2A). TEC 33 may be any of a number of sizes and types available. The polarity and magnitude of the applied voltage affects the nominal temperature differential between the two faces of the TEC, e.g. the upper and lower faces. The actual temperature differential is generally lower and depends on the rate at which heat must be dissipated from the DUT and on the type of the TEC; in extreme cases the temperature differential may become insignificant. Moreover, applying voltage of higher magnitude than that required for maintaining the temperature differential may cause significant current to flow through the TEC, resulting in ohmic losses, which generate added heat; such heat may be used to heat up the device when necessary. If a higher temperature differential is required, in addition to that available from a single TEC, one or more additional TECs may be interposed in tandem. In some other configurations of the system, the thermal head does not include a TEC.

Figure 5:
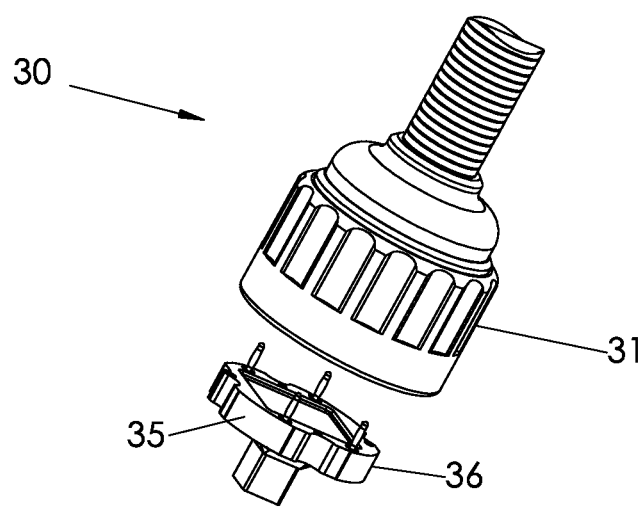
FIG. 5 illustrates in external view an alternative configuration of the thermal head of FIG. 3.

The heat spreader 32 (with its imbedded temperature sensor 39) and the TEC or TECs 33 jointly form the so-called thermal contactor part 35 of the thermal head, which has a length ranging from 20-100 mm. In some configurations of the head, as illustrated in FIG. 5 the thermal contactor is detachable and several different interchangeable thermal contactors may be provided, differing, for example, in the shape of the heat spreader and/or in the type of TEC or TECs, possibly also lacking a TEC altogether. Any of the thermal contactors may be attached to the head—to be used with corresponding types of electronic devices. As seen in FIG. 5, the thermal contactor has a number of electrical connectors 36, configured to engage matching connectors within the body of the head and serving to provide electrical connections to any temperature sensors and any heating elements within the heat spreader. It is noted that the detachability of the thermal contactor is also advantageous for facilitating the replacement of the TEC, which is a component typically prone to faults.

Figure 4:
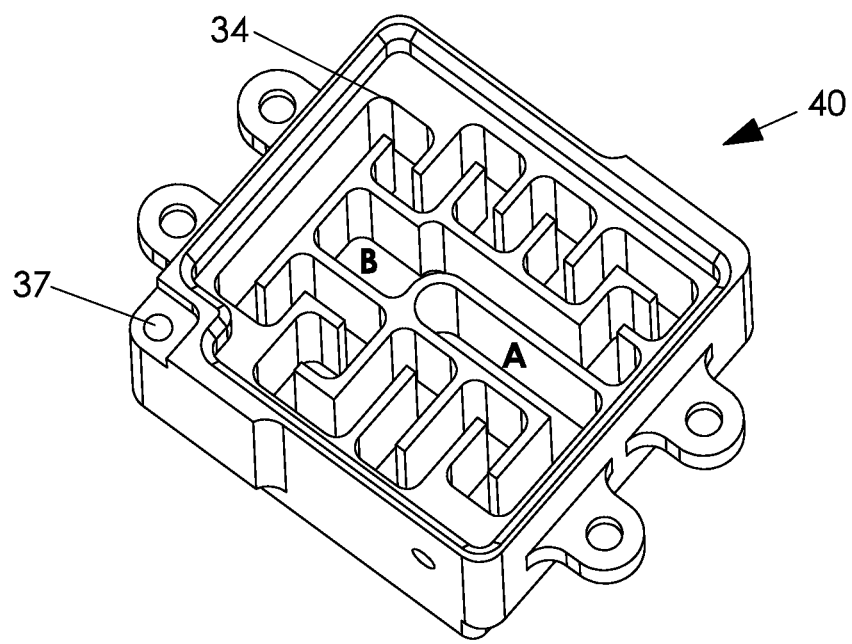
FIG. 4 is an isometric drawing, in top open view, of an embodiment of the evaporator and heat exchanger in the thermal head of the system of FIGS. 2A and 2B.

The evaporator 40 is the part of the temperature-forcing head that is in fluid communication with the refrigerant supply- and return tubes 21 and 22. It is formed as a closed chamber, with an inlet port and an outlet port, to which the ends of supply tube 21 and return tube 22 are respectively connected. FIG. 4 shows a preferred embodiment of evaporator 40 in top open view, wherein its interior is seen to be structured as a heat exchanger 34. The structure forms a maze-like canal, or passageway, through which the refrigerant flows from the inlet port (above point A in the drawing) to the outlet port (above point B). It thus presents a relatively large surface, over which any fluid flowing through the evaporator may readily come in contact and exchange heat therewith. Various configurations of heat exchanger 34 may employ different geometric shapes to achieve such a large surface, including, but not limited to, fins, pin-like or conical protrusions, and a plurality of passageways in parallel.

Preferably, a temperature sensor 37 is imbedded in the body of the evaporator 40 (FIG. 3)—most preferably at its heat exchanger portion 34, as illustrated in FIG. 4. Its output signal is fed, over a pair of wires (not shown), through cable 23, to the control unit 15. It serves to enable controlling the temperature of the heat exchanger (by means described below) so as to keep it at a level appropriate for dissipating heat from the DUT at its desired temperature level.

Operation of the system, with a thermal head in the configuration of FIG. 3, will now be described for each of two operational states—low- and high temperature at the device under test. The operational state is determined by the test requirements and is conveyed to the controller 15 from the test equipment by a suitable communication path (not shown). Switching between the two states is preferably effected either by changing the duty cycle of the compressor between a low value (for example 10% of the time, possibly even 0%, i.e. no operation) and a high value (for example 90% of the time, possibly even 100%, i.e. full operation) or by changing the operational speed of the compressor and/or by switching the bypass conduit 19 between open and closed states. It will be appreciated that any such switching will cause relatively fast transition between the two temperature states at the device under test.

In the low temperature state, bypass conduit 19 is closed. Action of compressor 12 causes pressure to be built up in the refrigerant throughout the upstream passageway up to the expansion valve 18. Resulting high-pressure and high-temperature gas, flowing through condenser 13, is cooled by atmospheric heat exchange (aided by blower 14) and is thus converted to liquid (still under high pressure). The pressure in the liquid refrigerant is reduced once it flows through the expansion valve, whence it flows, under low pressure, through supply tube 21 into the evaporator 40 (through its inlet port). The interior of the latter is kept at a low pressure, due to the drawing action of compressor 12 (through return tube 22). The liquid refrigerant flows through the passageway of heat exchanger 34, where it comes in contact with the large surface of its walls, absorbing the heat that has been discharged thereto from the heat spreader and consequently evaporating into gaseous state at a highly reduced temperature. The resultant gas flows, through the outlet port of the evaporator and return tube 22, back to the inlet of compressor 12, whence it is recycled.

The heat dissipated from heat exchanger 34 lowers its temperature, which in turn allows it to absorb heat from the adjacent face of TEC 33, lowering its own temperature. Electric current made to flow through the TEC in, say, the forward direction causes its other face to be at temperature that is, by a certain degree, lower than that of the first face, allowing it to absorb heat from the heat spreader 32, thus lowering also the latter's temperature, which similarly cools the device under test. The temperature of the heat spreader 32 is monitored, through sensor 39, by controller 15, which accordingly adjusts the voltage applied to TEC 33 so as to keep the sensed temperature at the desired value. It will be appreciated that the time constant of such a control loop is very short, resulting in a very stable temperature at the device.

For coarser temperature control, as for example in setting the nominal forcing temperature at a level higher than the minimum attainable or when the control range must extend beyond what is achievable by the TEC alone, the compressor is preferably operated intermittently, that is—it alternately operates for a given time period and rests for another period. The relative length of the operating period is called the duty cycle and is denoted as a percentage. During operation, full cooling is effected, as described above, whereas during the rest period the refrigerant remains gaseous. The frequency of such cycling is high enough to cause any resulting temperature variations in the heat exchanger to remain below a desired value, aided by its heat latency. The remaining temperature variations may be compensated for by the controlled operation of the TEC, as described above. The higher the duty cycle, the greater the average cooling effect and thus the lower the nominal device temperature. An alternative, or additional, coarse temperature control may be similarly provided by intermittently opening and closing the bypass conduit 19.

Additional control over the heat dissipation process and on the resultant temperatures, may be exerted by adjusting the stricture or opening of the expansion valve 18, thus controlling the rate of flow of the refrigerant and its pressure differential; the rate of flow affects the rate of heat dissipation within the heat exchanger 34, while the pressure differential influences the lowest temperature achievable by the evaporation process therein. A similar effect may be provided by varying the running speed of the compressor. It is noted that all these means provide a relatively fast response time whereby the temperature of the DUT is switchable at a rate of 0-150° C./min, and preferably at a rate of 50-150° C./min,—again contributing to temperature stability. When a temperature sensor 37 is imbedded in the body of the heat exchanger 34 (or generally in the evaporator), its signal is fed to the control unit 15, where it is used as a feedback signal in controlling the temperature of the heat exchanger by any of the means recounted above.

In a high-temperature state in which no heat dissipation from the DUT is desired, bypass conduit 19 is preferably open. The pressure in the refrigerant is thus not allowed to be lowered to a level at which it could liquefy and therefore it remains gaseous and, moreover is returned from the expansion valve directly to the compressor throughout the flow cycle. Alternatively the compressor 12 may be shut down altogether. Since now only a negligible cooling effect takes place in the evaporation chamber as a result of the remaining residual refrigerant that is undergoing evaporation, there is practically no heat dissipated from heat exchanger 34, resulting in a chain of rising temperatures, through the TEC and the heat spreader to the device under test. The latter's temperature is thus allowed to rise, by the effect of heat generated within it by its own operation during testing. If this is not sufficient, a voltage applied across TEC 33 in the reverse direction causes the temperature of its lower face to rise, which further warms the heat spreader and thence—the device. The heating effect in the TEC may be due to both the Peltier effect and ohmic losses. For extreme cases, a resistive electric heater (not shown) may be placed in the thermal head (e.g. within the heat spreader) and a current may be controllably driven therethrough. On the other hand, for the case that the device generates heat at a rate greater than that dissipated by its environment, some heat dissipation by the thermal head would be called for and then active cooling may be applied as described above for the low temperature case—albeit at a suitably low cooling rate.

The temperature level at the device is, again, accurately maintained by controlling the magnitude of the voltage applied to TEC 33 or to the resistive heater through a closed loop, involving sensor 39 and controller 15.

In certain configurations of thermal head 30, intended for testing devices where the lowest required forcing temperature is well above that achievable by the system in full operation, the head does not include a TEC, but preferably includes, instead, a simple electrically resistive (ohmic) layer between the heat exchanger 34 and the heat spreader 32. Alternatively a heating element may be imbedded in the heat spreader. Electrical current is controllably driven through the resistive layer (or the heating element) so as to provide additional heat that must be dissipated by the cooling system, thus, in effect, raising the forcing temperature of the device by a given amount. This resistive arrangement serves for finely and accurately controlling the device temperature, in a closed-loop manner similar to that effected by the TEC in the previously described configuration.

Figure 6:
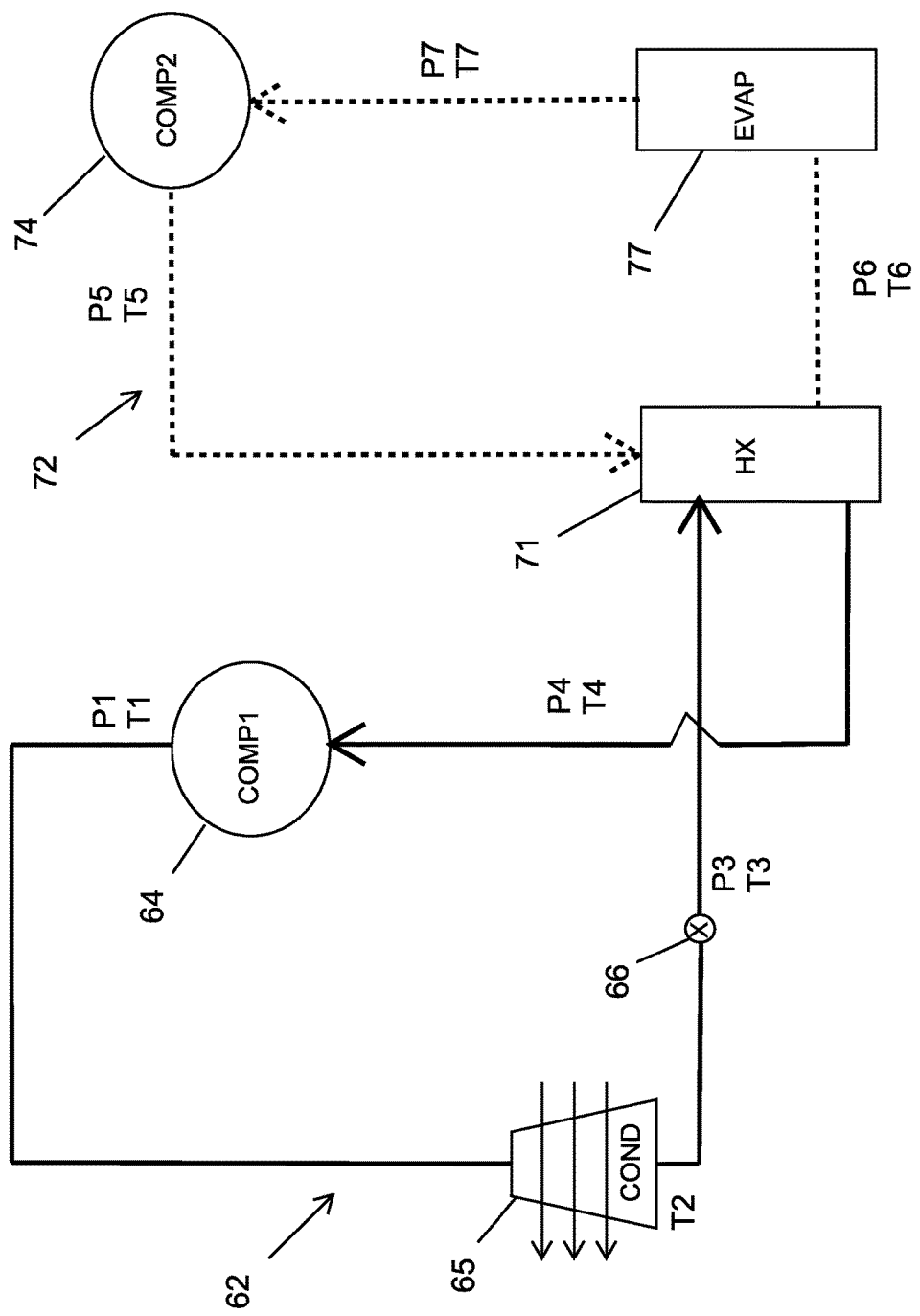
FIG. 6 is a schematic illustration of a thermodynamic cycle operating in conjunction with another embodiment of the invention.

FIG. 6 illustrates another embodiment of the invention wherein an extreme low device temperature is achievable by employing a cascading, two stage refrigeration cycle.

In the schematic illustration of the refrigeration cycle, the first stage refrigerant flows in closed loop conduit circuit 62 and second stage refrigerant, which may be of a different type than the first stage refrigerant to provide an increased cooling rate, flows in closed loop conduit circuit 72. The temperature of the first stage refrigerant may range from 0 to −60° C. and the temperature of the second stage refrigerant may range from 0 to −70° C., while their pressure may range from 0.7 to 24 bar. The higher pressure levels are sufficient to maintain the refrigerant in a liquid phase.

The structure of the central unit is similar to that of the single stage cycle, although provided with an additional compressor, conduit circuit and heat exchanger, and therefore need not be described, for brevity.

The first stage refrigerant is pressurized by first compressor 64 to a high pressure P1 and a high temperature T1, and is then cooled by condenser 65, e.g. an air-cooled type, to a temperature T2. After flow control device 66, e.g. a capillary tube, lowers the pressure of the first stage refrigerant to P3 and its temperature to T3, generally below 0° C., the first stage refrigerant is delivered to heat exchanger 71, in order to cool the second stage refrigerant exiting second compressor 74. The first stage refrigerant exiting heat exchanger 71 at a higher temperature of T4 and a higher pressure of P4 is delivered to first compressor 64.

The second stage refrigerant is pressurized by second compressor 74 to a high pressure P5 and a high temperature T5 greater than P1 and T1, respectively, and is then delivered to heat exchanger 71, whereat it is cooled by the first stage refrigerant to pressure P6 and temperature T6 greater than P3 and T3, respectively. The cooled second stage refrigerant flows to evaporator 77 retained in the temperature-forcing head, e.g. a labyrinth type evaporator, and is evaporated as a result of heat transfer from the DUT, producing a pressure P7 and a temperature T7 less than P3 and T3, respectively. The second stage refrigerant exiting evaporator 77 is delivered to second compressor 74.

EXAMPLE 1

A field-programmable gate array (FPGA) device was subjected to temperature forcing at extreme temperatures ranging at an extreme high temperature between 135 and 200° C. and at an extreme low temperature between 0 and −60° C. Freon R404A was used as the refrigerant.

The compressor pressurized the refrigerant to a pressure of 250-300 psi, resulting in a temperature of 50° C., and provided a suction pressure of 10-20 psi. The refrigerant was cooled by an air-cooled type condenser to a temperature of 30° C. A capillary tube lowered the pressure of the refrigerant to 20 psi and its temperature to −30° C.

The cooled refrigerant was delivered to a labyrinth type evaporator retained in the temperature-forcing head, and was evaporated as a result of heat transfer from the FPGA device, producing a temperature of −55° C. at a heat dissipation rate of up to 1 kW.

The compressor operated continuously during the cooling phase, and was not operated during the heating phase. A thermoelectric cooler provided in the temperature-forcing head was alternately operated and deactivated for a frequency ranging from 20-1000 Hz during both the cooling and heating phases.

The FPGA device was maintained at a constant temperature that did not fluctuate more than a temperature difference of 0.1° C. between two regions thereof. During testing, the temperature of the FPGA device was switched from an extreme high temperature 200° C. to an extreme low temperature of −60° C. a rate of 50-70° C./min, within a time period of 3.7-5.2 min.

EXAMPLE 2

A FPGA device was subjected to temperature forcing at extreme temperatures ranging at an extreme high temperature between 135 and 200° C. and at an extreme low temperature between −30 and −70° C. Freon R23 was used as the refrigerant in thermal contact with the device. The temperature-forcing head was not provided with a thermoelectric cooler, but rather the low temperatures were made possible by a two stage refrigeration cycle and the high temperatures were achieved by the use of a resistive heater.

In the first stage, a first compressor pressurized the R404A refrigerant to a pressure of 250-300 psi, resulting in a temperature of 50° C., and provided a suction pressure of 10-20 psi. The refrigerant was cooled by an air-cooled type condenser to a temperature of 30° C. A capillary tube lowered the pressure of the refrigerant to 20 psi and its temperature to −30° C.

In the second stage, a second compressor pressurized the R23 refrigerant to a pressure of 400-600 psi, resulting in a temperature of 70-80° C., and provided a suction pressure of 10 psi. The refrigerant exiting the second compressor was delivered to a plate type heat exchanger, and was thereby cooled by the R404A refrigerant circulating in separate alternating plate-shaped chambers to a temperature of −20° C. The cooled R23 refrigerant was delivered to a labyrinth type evaporator retained in the temperature-forcing head, and was evaporated as a result of heat transfer from the FPGA device, producing a temperature of −70 to −80° C. at a heat dissipation rate of up to 1 kW.

The first and second compressors operated continuously during the cooling phase. During the heating phase, a single resistive flat heater providing a heat influx of 0-1 kW was used. When the heater was operated for a duration ranging from one msec to one sec, a heating pulse of 1 W was generated.

The FPGA device was maintained at a constant temperature that did not fluctuate more than a temperature difference of 0.1° C. between two regions thereof. During testing, the temperature of the FPGA device was switched from an extreme high temperature 200° C. to an extreme low temperature of −70° C. a rate of 150° C./min, within a time period of 1.8 min.

While some embodiments of the invention have been described by way of illustration, it will be apparent that the invention can be carried out with many modifications, variations and adaptations, and with the use of numerous equivalents or alternative solutions that are within the scope of persons skilled in the art, without exceeding the scope of the claims.

The invention claimed is:

1. A temperature-forcing system for controlling the temperature of an electronic device under test, comprising:
   a refrigerant circulation subsystem configured to deliver a cooled first refrigerant through a first conduit circuit to a heat exchanger and to deliver a pressurized second refrigerant through a second conduit circuit to said heat exchanger so as to cool said second refrigerant; and
   a temperature-forcing head, associated with said refrigerant circulation subsystem, comprising:
   i) a heat spreader configured to be placed in thermal contact with said device under test;
   ii) an evaporator in thermal contact with said heat spreader configured to dissipate heat from said heat spreader by evaporation of said cooled second refrigerant flowing through said evaporator; and
   iii) a resistive heater located between said evaporator and said heat spreader and in thermal contact with said heat spreader and said evaporator,
   configured to provide heat in accordance with a current applied to said heater; wherein said second conduit circuit is configured to define at least one closed loop through which said second refrigerant is circulatable via said evaporator, so that, during circulation, said second refrigerant is maintained in liquid phase between said heat exchanger and said evaporator and at least partially in a gaseous phase while flowing through said evaporator;
   wherein said temperature-forcing head is formed as two parts that are mutually attachable and detachable, a first one of said parts comprising said resistive heater and said heat spreader and a second one of said parts comprising said evaporator.

2. The system of claim 1, wherein the temperature of said electronic device is maintained at a substantially constant temperature by means of said temperature-forcing head.

3. The system of claim 1, wherein the rate of heat dissipation from said electronic device is controllable by controlling refrigerant flow through said evaporator and said current applied to said heater.

4. The system of claim 1, wherein said evaporator is configured as a heat exchanger.

5. The system of claim 1, wherein said temperature-forcing head further incudes a temperature sensor configured to measure a temperature of said device.

6. The system of claim 1, wherein said temperature-forcing head further includes a thermo-electric cooler (TEC), wherein said TEC is configured to achieve lower temperatures at said heat spreader than those achievable by said evaporator alone.

7. The system of claim 1, wherein said refrigerant circulation subsystem further includes a bypass conduit, configured to selectively provide a flow path for refrigerant that avoids circulation through said evaporator.

8. The system of claim 1, wherein said refrigerant circulation subsystem is operative to circulate refrigerant intermittently, with at least one of a variable duty cycle and a variable rate of flow.

9. The system of claim 1, wherein said flow control device is an adjustable expansion valve.

10. The system of claim 1, wherein said second conduit circuit comprises a tube assembly, attached to said temperature-forcing head and configured to pass said second refrigerant from said refrigerant circulation subsystem to said evaporator and back from said evaporator to said refrigerant circulation subsystem.

11. The system of claim 10, wherein said tube assembly is connectable to, and detachable from, said refrigerant circulation subsystem.

12. The system of claim 1, further comprising at least one additional temperature-forcing head, each of said temperature-forcing heads, comprising a respective evaporator, heat spreader and resistive heater, wherein said subsystem is configured to circulate said second refrigerant through respective evaporators of each of said additional temperature-forcing heads.

13. The system of claim 1, wherein said refrigerant circulation subsystem comprises:
   said first conduit comprising a first compressor configured to pressurize said first refrigerant to a first pressure, a condenser configured to cool said pressurized first refrigerant and a metering device configured to induce a pressure drop in said cooled first refrigerant;
   said second conduit comprising a second compressor configured to pressurize said second refrigerant to a pressure greater than said first pressure; and
   said heat exchanger configured to transfer heat from said pressurized second refrigerant to said cooled first refrigerant.

14. The system of claim 1, wherein said heater is embedded in said heat spreader.

15. The system of claim 1, wherein said heater comprises a flat resistive layer between said heat spreader and said evaporator.

16. The system of claim 1, wherein said refrigerant circulation subsystem comprises a single flow control device.

17. A method for forcing the temperature of an electronic device under test, comprising:

providing a refrigerant circulation subsystem, configured to deliver a cooled first refrigerant through a first conduit circuit to a heat exchanger and to deliver a pressurized second refrigerant through a second conduit circuit to said heat exchanger so as to cool said second refrigerant;

providing a temperature-forcing head, comprising:

a heat spreader configured to be placed in thermal contact with said device under test;

an evaporator in thermal contact with said heat spreader configured to dissipate heat from said heat spreader by evaporation of said cooled second refrigerant flowing through said evaporator via said second conduit circuit; and a resistive heater located between said evaporator and said heat spreader and in thermal contact with said heat spreader and said evaporator, configured to provide heat in accordance with a current applied to said heater;

wherein said temperature-forcing head is formed as two parts that are mutually attachable and detachable, a first one of said parts comprising said resistive heater and said heat spreader and a second one of said parts comprising said evaporator;

placing said heat spreader in thermal contact with said device;

causing said refrigerant circulation subsystem to circulate said second refrigerant through said evaporator;

when heat dissipation from said device is required, evaporating at least part of said second refrigerant flowing through said evaporator; and when provision of heat to said device is required, applying a current to said resistive heater.

18. A method according to claim 17, wherein said refrigerant circulation subsystem comprises:

said first conduit comprising a first compressor configured to pressurize said first refrigerant to a first pressure, a condenser configured to cool said pressurized first refrigerant and a metering device configured to induce a pressure drop in said cooled first refrigerant;

said second conduit comprising a second compressor configured to pressurize said second refrigerant to a pressure greater than said first pressure; and said heat exchanger configured to dissipate heat from said pressurized second refrigerant to said cooled first refrigerant.

19. The method of claim 17, wherein said heater is embedded in said heat spreader.

20. The method of claim 17, wherein said heater comprises a flat resistive layer between said heat spreader and said evaporator.

21. A method according to claim 17, wherein said temperature forcing head further comprises a temperature sensor configured to measure a temperature of said device, so as to enable controlling refrigerant flow through said evaporator in accordance with temperature feedback measurements from said temperature sensor.

* * * * *